(12) United States Patent
Khanna et al.

(10) Patent No.: US 7,382,620 B2
(45) Date of Patent: Jun. 3, 2008

(54) METHOD AND APPARATUS FOR OPTIMIZING HEAT TRANSFER WITH ELECTRONIC COMPONENTS

(75) Inventors: Vijayeshwar Das Khanna, Millwood, NY (US); Joseph Kuczynski, Rochester, MN (US); Arvind Kumar Sinha, Rochester, MN (US); Sri M. Sri-Jayantha, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 150 days.

(21) Appl. No.: 11/249,911

(22) Filed: Oct. 13, 2005

(65) Prior Publication Data

US 2007/0086168 A1 Apr. 19, 2007

(51) Int. Cl.
*H05K 7/20* (2006.01)
*F28F 7/00* (2006.01)
*H01L 23/34* (2006.01)

(52) U.S. Cl. ............ 361/719; 165/80.3; 165/185; 257/719; 361/704; 361/705; 361/708

(58) Field of Classification Search .......... 361/705, 361/708, 719; 257/719
See application file for complete search history.

(56) References Cited

U.S. PATENT DOCUMENTS

| | | | |
|---|---|---|---|
| 4,814,943 A * | 3/1989 | Okuaki | 361/783 |
| 5,311,060 A * | 5/1994 | Rostoker et al. | 257/796 |
| 5,386,342 A * | 1/1995 | Rostoker | 361/749 |
| 5,510,956 A * | 4/1996 | Suzuki | 361/704 |
| 5,528,457 A * | 6/1996 | Hawke et al. | 361/706 |
| 5,793,106 A * | 8/1998 | Yasukawa et al. | 257/712 |
| 5,940,271 A * | 8/1999 | Mertol | 361/704 |
| 6,016,006 A * | 1/2000 | Kolman et al. | 257/712 |
| 6,212,074 B1 * | 4/2001 | Gonsalves et al. | 361/717 |
| 6,229,702 B1 * | 5/2001 | Tao et al. | 361/704 |
| 6,392,887 B1 * | 5/2002 | Day et al. | 361/704 |
| 6,785,137 B2 * | 8/2004 | Siegel | 361/704 |
| 6,891,259 B2 * | 5/2005 | Im et al. | 257/687 |
| 7,057,896 B2 * | 6/2006 | Matsuo et al. | 361/704 |

* cited by examiner

*Primary Examiner*—Gregory D Thompson
(74) *Attorney, Agent, or Firm*—Matthew C. Zehrer

(57) ABSTRACT

A heat transfer assembly includes a printed circuit board assembly supporting an electronic component assembly including one or more semiconductor chips. A heat sink assembly is adapted to be placed in thermal engagement with the one or more semiconductor chips. Included is a loading assembly for loading the one or more semiconductor chips toward engagement with the heat sink assembly. An encapsulating mechanism is provided that contains a sufficient amount of a thermally conductive medium to transfer heat between a surface of one or more of the semiconductor chips and the heat sink assembly, wherein the thermally conductive medium fills any gaps or space between the one or more semiconductor chips and the heat sink assembly.

16 Claims, 4 Drawing Sheets

METHOD AND APPARATUS FOR OPTIMIZING HEAT TRANSFER WITH ELECTRONIC COMPONENTS

BACKGROUND OF THE INVENTION

The present invention relates in general to the field of heat transfer, and, in particular, to a heat transfer assembly and method that efficiently removes heat from electronic components.

Electronic components, such as microprocessors and integrated circuits, must operate within certain specified temperature ranges to perform efficiently. Excessive heat degrades electronic component performance, reliability, life expectancy, and can even cause failure. Heat sinks are widely used for controlling excessive heat. Typically, heat sinks are formed with fins, pins, or other similar structures to increase the surface area of the heat sink and thereby enhance heat dissipation as air passes over the heat sink. In addition, it is not uncommon for heat sinks to contain high performance structures, such as vapor chambers and/or heat pipes, to enhance further heat transfer. Heat sinks are typically formed of metals, such as copper or aluminum. More recently, graphite-based materials have been used for heat sinks because such materials offer several advantages, such as improved thermal conductivity and reduced weight.

Electronic components are generally packaged using electronic packages (i.e., modules) that include a module substrate to which the electronic component is electronically connected. In some cases, the module includes a cap (i.e., a capped module) which seals the electronic component within the module. In other cases, the module does not include a cap (i.e., a bare-die module) wherein the electronic component directly engages the heat sink.

Bare-die modules are generally preferred over capped modules from a thermal performance perspective. In the case of a capped module, a heat sink is typically attached having a thermal interface gap material existing between a bottom surface of the heat sink and a top surface of the cap, and another thermal interface gap material existing between a bottom surface of the cap and a top surface of the electronic component. In the case of a bare-die module, a heat sink has a thermal interface gap material existing between a bottom surface of the heat sink and a top surface of the electronic component. Bare-die modules typically exhibit better thermal performance than capped modules because bare-die modules eliminate two sources of thermal resistance present in capped modules, i.e., the thermal resistance of the cap and the thermal resistance of the thermal interface gap material between the cap and the electronic component. Accordingly, bare-die modules are typically used to package electronic components, such as semiconductor chips, that require high total power dissipation.

Heat sinks are attached to modules using a variety of attachment mechanisms, such as clamps, bolts, and other hardware. The attachment mechanism typically applies a force that maintains a thermal interface gap, i.e., the thickness of the thermal interface gap material extending between the heat sink and the module. In the case of a capped module, the cap protects the electronic component from physical damage from the applied force. In the case of a bare-die module, however, the applied force is transferred directly through the electronic component itself onto the bare-die module. Consequently, when bare-die modules are used, the attachment mechanism typically applies a compliant force to decrease stresses on the electronic component.

FIG. 1 illustrates an example of a prior art attachment mechanism for attaching a heat sink to a bare-die module. There is illustrated a circuit board assembly 100 that includes a printed circuit board 105, and a bare-die module 110. Bare-die module 110 includes a module substrate 115, an electronic component, such as a semiconductor chip 120, and an electronic connection 125. Semiconductor chip 120 is electrically connected to module substrate 115. Electronic connection 125, which electrically connects printed circuit board 105 to module substrate 115, may be a pin grid array (PGA), a ceramic column grid array (CCGA), a land grid array (LGA), or the like. Semiconductor chip 120 is thermally connected to a heat sink 130 through a thermal interface gap material 135. The thermal interface gap material maybe a layer of a thermally conductive medium, such as thermal paste, grease, oil, or other high thermal conductivity material. Typically, the thermal interface gap material 135 is relatively thin so that it may effectively transfer heat away from the bare-die module 110 and toward heat sink 130. The thickness of thermal interface gap material 135 extending between heat sink 130 and semiconductor chip 120 is referred to as the thermal interface gap.

Heat sink 130 is attached to bare-die module 110 using bolts 140. Bolts 140 pass through thru-holes 131 in heat sink 130 and thru-holes 106 in printed circuit board 105 and are threaded into threaded-holes 146 in a backside bolster 145. Typically, bolts 140 are arranged one at each corner of the electronic component 120, or one on each side of the electronic component 120. Bolts 140 are tightened by threading a threaded portion of bolts 140 into threaded-holes 146 in backside bolster 145. As bolts 140 are tightened, heat sink 130 engages semiconductor chip 120 through thermal interface gap material 135. Additional tightening of bolts 140 causes deflection (bowing) of the printed circuit board 105, which applies a compliant force to bare-die module 110. More particularly, printed circuit board 105 is slightly flexed in a concave-arc fashion with respect to bare-die module 110.

Presently, some computer systems use multiple chip assemblies that require high and stable loading. The multiple chip assemblies have very thin thermal gaps filled with a thermal interface layer to establish thermal engagement with the heat sink. However, due to physical chip height variations, the noted deflections can lead to non-planar thermal interfaces being formed, thereby resulting in possible thermal degradation of the CPU. Moreover, the detrimental effects due to differences in chip height get more pronounced with power cycling loading. During power cycling loading, the chip heat dissipation results in a temperature gradient across the chip, thermal interface layer, and heat sink base. This temperature gradient has thermal transients around the vicinity of the chip, thereby resulting in distortion or relative movement of the heat sink base to the chip. These effects are further compounded when a bare-die solution is used. Consequently, thermal efficiency is compromised. Accordingly, continuing efforts are being made to improve thermal efficiency in such situations.

SUMMARY OF THE INVENTION

An aspect of the present invention provides an enhanced mounting system and method for enhancing the efficient transfer of heat in a manner substantially without negative effect and that overcomes many of the disadvantages of prior art arrangements.

In accordance with one aspect of the present invention, provision is made for a heat transfer method comprising:

providing a heat sink assembly; providing a source of heat having one or more heat source elements, wherein each of one of the one or more heat source elements has space between it and the heat sink assembly when joined to the source of heat under loading; and, encapsulating the one or more heat source elements in a thermally conductive medium so that the thermally conductive medium remains in any space between the one or more heat source elements and the heat sink assembly.

In accordance with another aspect of the present invention, provision is made for a heat transfer assembly comprising: a printed circuit board having an electronic component assembly including one or more semiconductor chips, a heat sink assembly adapted to be placed in thermal engagement with the electronic component assembly, and a loading assembly for urging the electronic component assembly toward engagement with at least one of the semiconductor chips; and a thermal conductive fluid medium assembly that contains a sufficient amount of a thermally conductive medium to transfer heat between a surface of alone or more of the semiconductor chips and the heat sink assembly.

BRIEF DESCRIPTION OF THE DRAWINGS

The preferred exemplary embodiments of aspects of the present invention will hereinafter be described in conjunction with the appended drawings, wherein like designations denote like elements.

DETAILED DESCRIPTION

Figure 2:
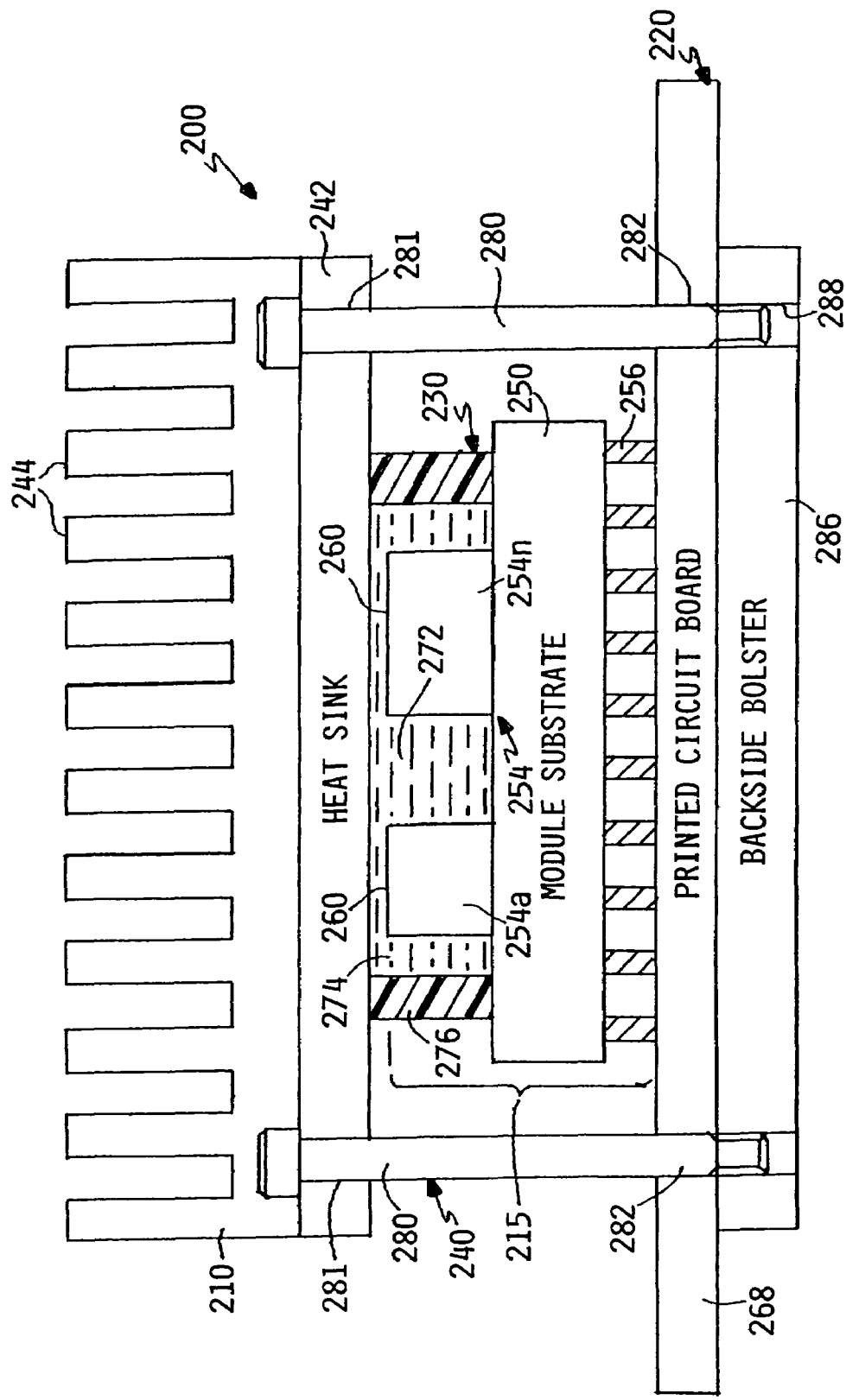
FIG. 2 is a cross-sectional longitudinal view of a heat transfer assembly.
Figure 3:
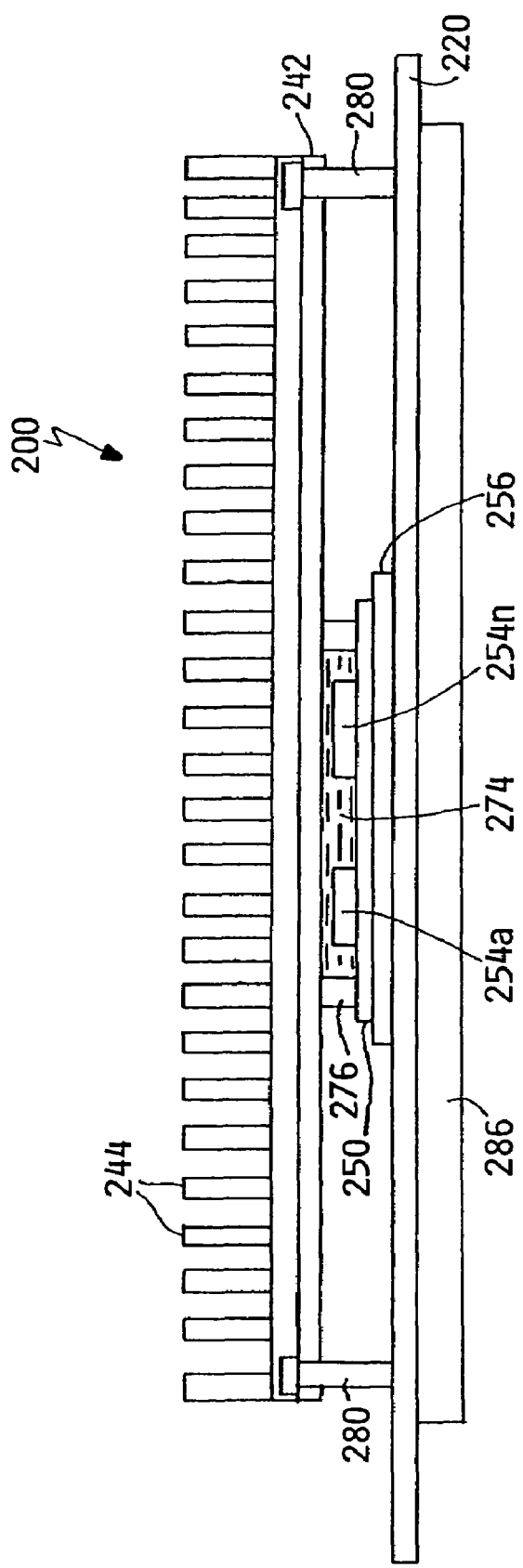
FIG. 3 is a cross-sectional view of a heat transfer assembly shown in FIG. 2 but with portions removed for clarity of illustrating the invention.
Figure 4:
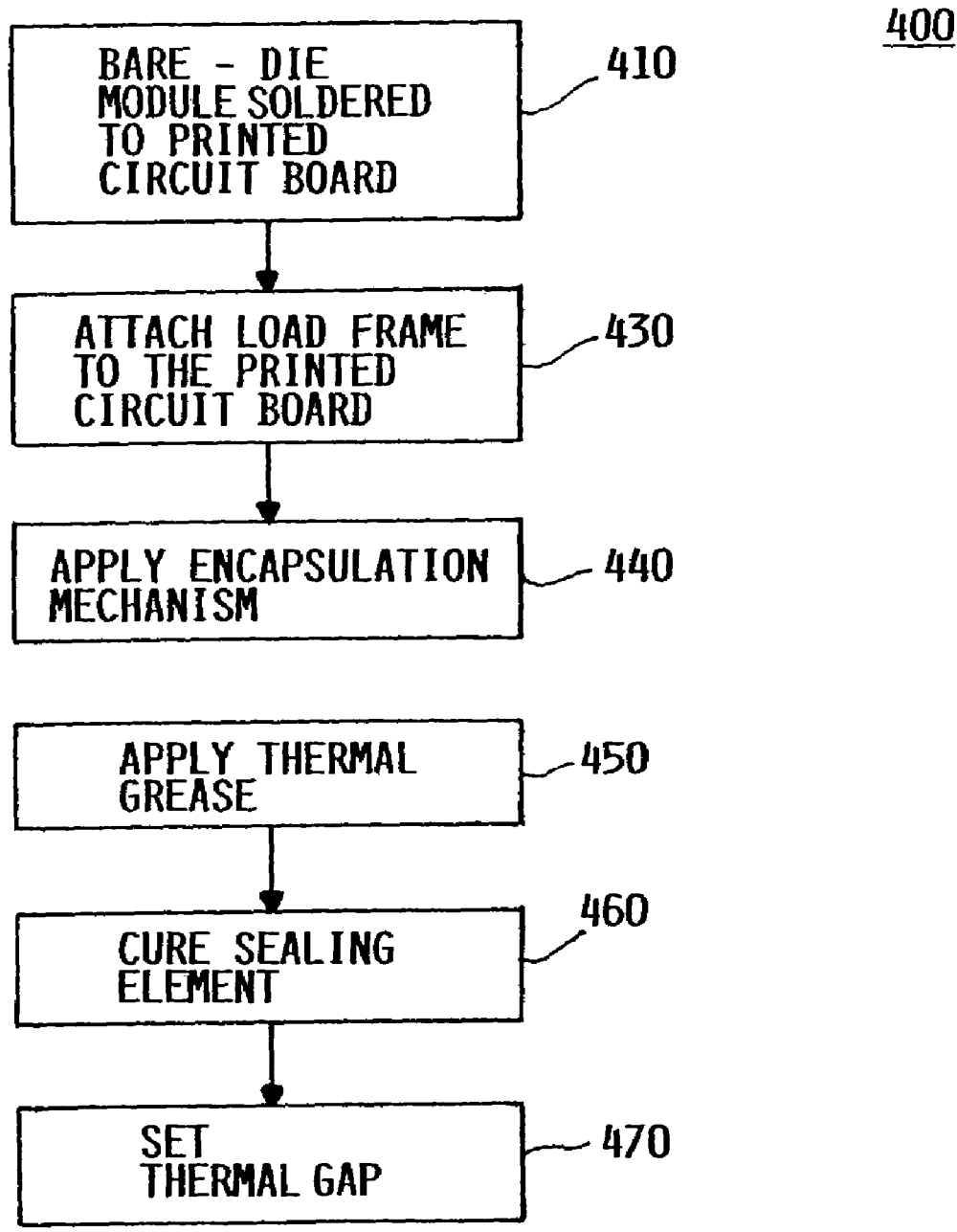
FIG. 4 is a flow diagram of a method for mounting a heat sink assembly in thermal transfer arrangement with an electronic component.

Reference is now made to FIGS. 2-4 for illustrating a heat transfer assembly 200 in accordance with the preferred embodiments of the present invention, which implement an improved process for mounting a heat sink on a heat source, such as an electronic component. FIGS. 2-4 are intended to depict the representative major components of heat transfer assembly 200 at a high level, it being understood that individual components may have lesser or greater complexity than represented in FIG. 2-4, and that the number, type and configuration of such components may vary. For example, heat transfer assembly 200 may contain a different number, type and configuration of heat sources (e.g., electrical assembly components) than shown.

As illustrated in FIGS. 2-3, there is provided a heat transfer assembly 200. The heat transfer assembly 200 comprises a heat sink assembly 210, an electronic component assembly 215 mounted on a printed circuit board assembly 220, an encapsulating mechanism 230, and a frame loading assembly 240. The heat sink assembly 210 includes a base plate 242 and a plurality of fins 244 or other similar structures to increase the surface area of the heat sink assembly and thereby enhance heat dissipation as air passes over the heat sink assembly. It is also preferable for the heat sink assembly to contain high performance structures, such as vapor chambers and/or heat pipes (not shown) to further enhance heat transfer. The heat sink base plate 242 and fins 244 may be made of a variety of suitable materials, such as aluminum and graphite. In an illustrated embodiment, the electronic component assembly 215 includes a module substrate 250, an electronic component 254, and an electronic connection 256.

In the illustrated embodiment, the electronic component 254 is a multi-chip module (MCM) that includes for example, one or more bare-die semiconductor chips 254a, 254n (collectively 254). The present invention envisions other embodiments, such as use of a single-chip module (SCM). Those skilled in the art will recognize that the invention can be practiced with more than one SCM or MCM and/or other electronic components. Each semiconductor chip will have when mounted a gap 260 in-between its upper surface as viewed in the drawings and a bottom surface of the heat sink. Because of the differences in gap dimensions, it is difficult to place the right amount of thermally conductive medium therein. This is so because of chip height differences. This is compounded with a known squeezing action exerted on the thermally conductive medium in the gaps when subjected to forces of the kind envisioned.

The electronic connection 256 maybe any one of several known connections. Exemplary connectors may include a pin grid array (PGA), a ceramic column grid array (CCGA), a land grid array (LGA), or the like. The printed circuit board assembly 220 includes a printed circuit board 268 that carries the electronic component assembly 215.

One aspect of this invention is that it encapsulates the bare-die semiconductor chips 254 in an encapsulating mechanism 230 that insures an efficient transfer of heat without degradation of the heat efficiency. The encapsulating mechanism 230 defines an enclosed reservoir 272 to house a suitable thermally conductive medium 274. The thermally conductive medium 274 is provided in an amount that is adequate to fill any gaps 260 between top surfaces of the chip(s) and the heat sink under loading conditions to be described. This compensates for chip height variations that provide different gaps. The thermally conductive medium 274, preferably, may be a suitable thermally conductive fluid material, such as a thermal grease 274, gels, and pastes. The thermally conductive medium will also remain in any other space between the chips and the heat sink assembly. Accordingly, sufficient thermal grease will remain in all the gaps or any other space for that matter between the several semiconductor chips 254 and the heat sink assembly regardless of chip height variations. Therefore, having a sufficient quantity of thermal grease 274 obviates the negative effects of chip height differences. It also minimizes the thermal grease being squeezed from the gaps during loading of the heat transfer assembly by the frame loading assembly 240.

The encapsulating mechanism 230 includes, preferably, a continuous and compressible sealing element 276 or gasket element 276. The sealing element 276 can be made from any suitable elastomeric material, such as a strip of resinous material, (e.g., silicone or epoxy resins) or natural rubber. The sealing element 276 may be treated, of course, with additive materials that can be added for effecting different functions, such as electromagnetic shielding materials being added for enhancing EMC. The sealing element 276 may be applied in any known manner to peripherally encompass the semiconductor chips 254. The sealing element 276 may be adhesively bonded at its junctions or interfaces to the heat sink assembly and the module substrate. Alternatively and preferably, the sealing element 276 could be dispensed using a suitable gasket applicator device (not shown) to a controllable predetermined height in a suitable pattern, for example rectangular, to peripherally surround or encompass the semiconductor chips 254. In this manner, the sealing element 276 can be applied without resorting to the stocking of gaskets having preformed predetermined sizes. Because the maximum chip height is known, it is a relatively straightforward procedure to adjust the height of the sealing element 276 to be adequately higher than the semiconductor chips 254 when compressed for ensuring the retention of the thermal grease 274. Once the sealing element 276 has been applied, the heat sink assembly can be positioned over the chips and the normal load applied to the heat transfer assembly 200 by the loading mechanism 240. Loading the sealing element 276 during loading of the heat sink assembly will affect a fluid-tight seal between the heat sink and the module substrate, thereby retaining the thermally conductive medium 274. While the encapsulating mechanism 230 is self-contained, it will be appreciated that the thermal grease in the reservoir 272 can be externally supplied under pressure. Another aspect of the sealing element 276 is that it includes a thermal coefficient of expansion (CTE) value that falls within the different coefficient of expansion (CTE) values of the module substrate 250 and the heat sink assembly 210. It has been determined that this relationship tends to minimize any stresses building up on the sealing element 276 relative to the heat sink assembly when the system is heated, thereby minimizing the likelihood of the sealing element becoming dislodged or distorted relative to the heat sink.

Figure 1:
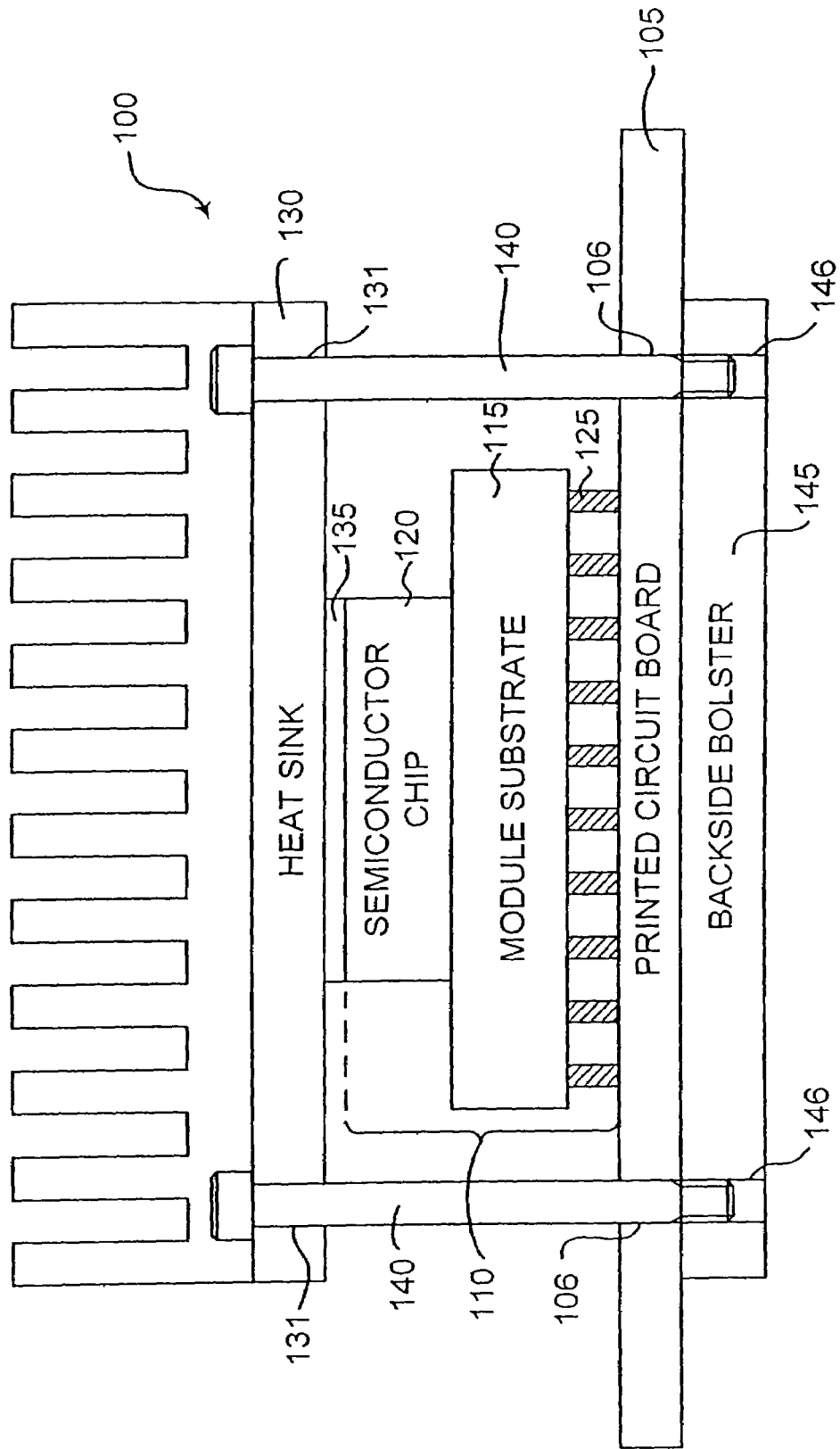
FIG. 1 illustrates an example of a prior art attachment mechanism for attachment of a heat sink to a bare-die module.

The loading mechanism 240 may be similar to that described above concerning FIG. 1. To supplement such understanding, however, the following brief description is set forth. The heat sink base 242 is attached to the electronic component assembly 215 using bolts 280. Bolts 280 pass through thru-holes 281 in heat sink base 242 and thru-holes 282 in printed circuit board and are threaded into threaded-holes 288 in a backside bolster 286. Typically, bolts 280 are arranged one at each corner of the electronic component assembly. The bolts 280 are tightened by threading a threaded portion of bolts into the threaded-holes 288 in the backside bolster 286. As the bolts 280 are tightened, the heat sink base 242 is brought to a thermally juxtaposed relationship with the semiconductor chips 254. Additional tightening of the bolts 280 causes deflection (bowing), not shown, of the printed circuit board 268 thereby applying a compliant force to the semiconductor chips 254. More particularly, the printed circuit board is slightly flexed in a concave-arc (not shown) with respect to semiconductor chips when loaded so as to set the thermal gaps 260 in a thermal transfer relationship to the heat sink.

FIG. 4 is a flow diagram of a method 400 for mounting a heat sink in thermal contact with an electronic component according to a preferred embodiment of the present invention. Method 400 sets forth a preferred order of the steps. It must be understood, however, that the various steps may occur at any time relative to one another. The electronic component assembly 215 is soldered to the printed circuit board 268 (block 410). The frame loading assembly 240 is attached to the printed circuit board (block 430) and the heat sink assembly. The encapsulating mechanism 230 has its sealing element 276 applied to the module substrate 250 to a height sufficient to provide the thermal medium reservoir (block 440). The thermal grease 274 is loaded into the reservoir 272 (block 450). The sealing element 276 is cured (block 460) at appropriate temperatures and conditions, not forming a part of the invention, so that it will be appropriately bonded to and between the heat sink assembly and the module substrate 250 to form a fluid sealing relationship. The method 400 continues with the application of a preload force using the frame loading mechanism 240 to set the thermal interface gaps 260 (block 470). During loading (block 470), the actuation bolt 280 is turned an appropriate amount to apply a preload force (e.g., 40 lbs) that provides the desired thermal interface gap (e.g., 1.2 mils). In other words, the thermally conductive medium will remain in the gaps as the preload force is applied to set the gaps. Hence, the desired gap is filled with the thermally conductive medium. Once this point is reached, the thermally conductive medium may be thermally cured in any suitable manner.

The embodiments and examples set forth herein were presented in order to explain best the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A heat transfer method comprising: providing a heat sink assembly; providing a source of heat comprising a module substrate supporting one or more heat source elements thereupon, wherein each of the one or more heat source elements has space between it and the heat sink assembly when joined to the source of heat; and, encapsulating the one or more heat source elements in a thermally conductive medium with an encapsulating mechanism so that the thermally conductive medium remains in any space between the one or more heat source elements and the heat sink assembly, wherein the heat sink assembly has a larger outside diameter than the encapsulating mechanism, wherein a loading assembly urges the one or more heat source elements toward engagement with the heat sink assembly external to the module substrate and the encapsulating mechanism, and wherein the height of the encapsulating mechanism is adjusted to be adequately higher than the tallest of the one or more heat source elements when the encapsulating mechanism is compressed.

2. The heat transfer method of claim 1 wherein the encapsulating is provided by the encapsulating mechanism that includes a sealing element that encompasses the one or more heat source elements and the thermally conductive medium, wherein the sealing element is compressible to provide a fluid-tight seal at junctions between the source of heat and the sealing element, and at junctions between the heat sink assembly and the sealing element.

3. The heat transfer method of claim 2 wherein the sealing element is provided with a coefficient of thermal expansion (CTE) value between a coefficient of thermal expansion (CTE) value of the heat sink assembly and a coefficient of thermal expansion (CTE) value of the source of heat.

4. The heat transfer method of claim 2 wherein the sealing element is a gasket member that has been applied to a predetermined height that is sufficient to enclose the one or more heat source elements and the thermally conductive medium.

5. The assembly of claim 1 wherein the thermally conductive medium is a thermal grease.

6. A heat transfer assembly comprising: a source of heat comprising a module substrate supporting one or more heat source elements thereupon, a heat sink assembly adapted to be placed in juxtaposition with the one or more heat source elements; a loading assembly for urging under loading the one or more heat source elements toward engagement with the heat sink assembly; and, an encapsulating mechanism that contains a sufficient amount of a thermally conductive medium to transfer heat between a surface of one or more of the one or more heat source elements and the heat sink assembly, wherein the thermally conductive medium fills any gaps or space between the one or more heat source elements and the heat sink assembly, wherein the heat sink assembly has a larger outside diameter than the encapsulating mechanism, wherein the loading assembly urges the one or more heat source elements toward engagement with the heat sink assembly external to the module substrate and the encapsulating mechanism, and wherein the height of the encapsulating mechanism is adjusted to be adequately higher than the tallest of the one or more heat source elements when the encapsulating mechanism is compressed.

7. The assembly of claim 6 wherein the encapsulating mechanism includes a sealing element that encompasses the one or more heat source elements and the thermally conductive medium, wherein the sealing element is compressible to provide a fluid-tight seal at junctions between the source of heat and the sealing element, and at junctions between the heat sink assembly and the sealing element.

8. The assembly of claim 7 wherein the sealing element has a coefficient of thermal expansion (CTE) value between a coefficient of thermal expansion (CTE) value of the heat sink assembly and a coefficient of thermal expansion (CTE) value of the source of heat.

9. The assembly of claim 7 wherein the sealing element has been applied to a predetermined height higher than is sufficient to encompass the one or more heat source elements and the thermally conductive medium.

10. The assembly of claim 7 wherein the thermally conductive medium is a thermal grease.

11. A heat transfer assembly comprising: a printed circuit board assembly; an electronic component assembly comprising a module substrate supporting one or more semiconductor chips, the module substrate supported by the printed circuit board assembly; a heat sink assembly adapted to be placed in thermal juxtaposition with the one or more semiconductor chips; a loading assembly for urging, under loading, the one or more semiconductor chips toward engagement with the heat sink assembly; and, an encapsulating mechanism that contains a sufficient amount of a thermally conductive medium to transfer heat between a surface of one or more of the semiconductor chips and the heat sink assembly, wherein the thermally conductive medium fills any gaps or space between the one or more semiconductor chips and the heat sink assembly, wherein the heat sink assembly has a larger outside diameter than the encapsulating mechanism, wherein the loading assembly urges the one or more heat source elements toward engagement with the heat sink assembly external to the module substrate and the encapsulating mechanism, and wherein the height of the encapsulating mechanism is adjusted to be adequately higher than the tallest of the one or more heat source elements when the encapsulating mechanism is compressed.

12. The assembly of claim 11 wherein the encapsulating mechanism includes a sealing element that encompasses the one or more semiconductor chips, wherein the sealing element is compressible to provide a fluid-tight seal between the electronic component and the sealing element, and the heat sink assembly and the sealing element.

13. The assembly of claim 12 wherein the sealing element is a gasket made of a resinous material.

14. The assembly of claim 12 where the sealing element has a coefficient of thermal expansion (CTE) value between a coefficient of thermal expansion (CTE) value of the heat sink assembly and a coefficient of thermal expansion (CTE) value of the an electronic component assembly.

15. The assembly of claim 12 wherein the sealing element has been applied as a strip to a predetermined height sufficient to encompass the one or more semiconductor chips and the thermally conductive medium.

16. The assembly of claim 12 wherein the thermally conductive medium is a thermal grease.

* * * * *